(12) United States Patent
Zhang et al.

(10) Patent No.: US 11,322,653 B2
(45) Date of Patent: May 3, 2022

(54) LIGHT-EMITTING DEVICE WITH OPTICAL POWER READOUT

(71) Applicant: BOLB INC., San Jose, CA (US)

(72) Inventors: Jianping Zhang, Livermore, CA (US); Ying Gao, Livermore, CA (US); Ling Zhou, Livermore, CA (US); Alexander Lunev, Livermore, CA (US)

(73) Assignee: BOLB INC., Livermore, CA (US)

( * ) Notice: Subject to any disclaimer, the term of this patent is extended or adjusted under 35 U.S.C. 154(b) by 7 days.

(21) Appl. No.: 16/984,008

(22) Filed: Aug. 3, 2020

(65) Prior Publication Data

US 2020/0365766 A1 Nov. 19, 2020

Related U.S. Application Data

(63) Continuation of application No. 16/046,917, filed on Jul. 26, 2018, now abandoned.

(51) Int. Cl.
| | |
|---|---|
| *H01L 31/0328* | (2006.01) |
| *H01L 33/32* | (2010.01) |
| *H01L 31/173* | (2006.01) |
| *H01L 31/0304* | (2006.01) |
| *H01L 25/16* | (2006.01) |
| *H01L 31/167* | (2006.01) |

(52) U.S. Cl.
CPC ............ *H01L 33/32* (2013.01); *H01L 25/167* (2013.01); *H01L 31/03044* (2013.01); *H01L 31/167* (2013.01); *H01L 31/173* (2013.01)

(58) Field of Classification Search
CPC . H01L 33/32; H01L 31/173; H01L 31/03044; H01L 31/03048; H01L 33/007; H01L 31/1848; H01L 25/167; H01L 31/165; H01L 31/167; H01L 31/02019; H01L 31/022408; H01L 33/025; H01L 33/20; H01L 27/15; H01L 33/24; H01L 33/48; H01L 33/62
See application file for complete search history.

(56) References Cited

U.S. PATENT DOCUMENTS

| | | | |
|---|---|---|---|
| 7,982,226 B2 * | 7/2011 | Lee | H01L 31/02327 257/80 |
| 9,685,577 B2 * | 6/2017 | Jiang | H01L 33/32 |
| 2010/0001300 A1 * | 1/2010 | Raring | H01L 27/153 257/90 |
| 2013/0299841 A1 * | 11/2013 | Ranglack | H01L 31/03044 257/76 |
| 2018/0047882 A1 * | 2/2018 | Hayakawa | H01L 27/15 |
| 2019/0115497 A1 * | 4/2019 | Zhang | H01L 33/325 |
| 2019/0124738 A1 * | 4/2019 | Takagi | H01L 31/02019 |

* cited by examiner

*Primary Examiner* — Shouxiang Hu
(74) *Attorney, Agent, or Firm* — J.C. Patents

(57) ABSTRACT

A light emitting device with on-chip optical power readout includes a light emitting mesa and a light detecting mesa formed adjacent to each other on the same substrate of a chip, and a portion of the light emitted from the light emitting mesa is transmitted to the light detecting mesa at least through the substrate. The light emitting mesa and the light detecting mesa have exactly the same epitaxial structure and can be electrically isolated from each other by an insulation layer, or an airgap formed therebetween, or by ion implantation. The light emitting mesa and the light detecting mesa can also share an n-type structure and a common n-electrode while having their own p-electrode, respectively.

16 Claims, 15 Drawing Sheets

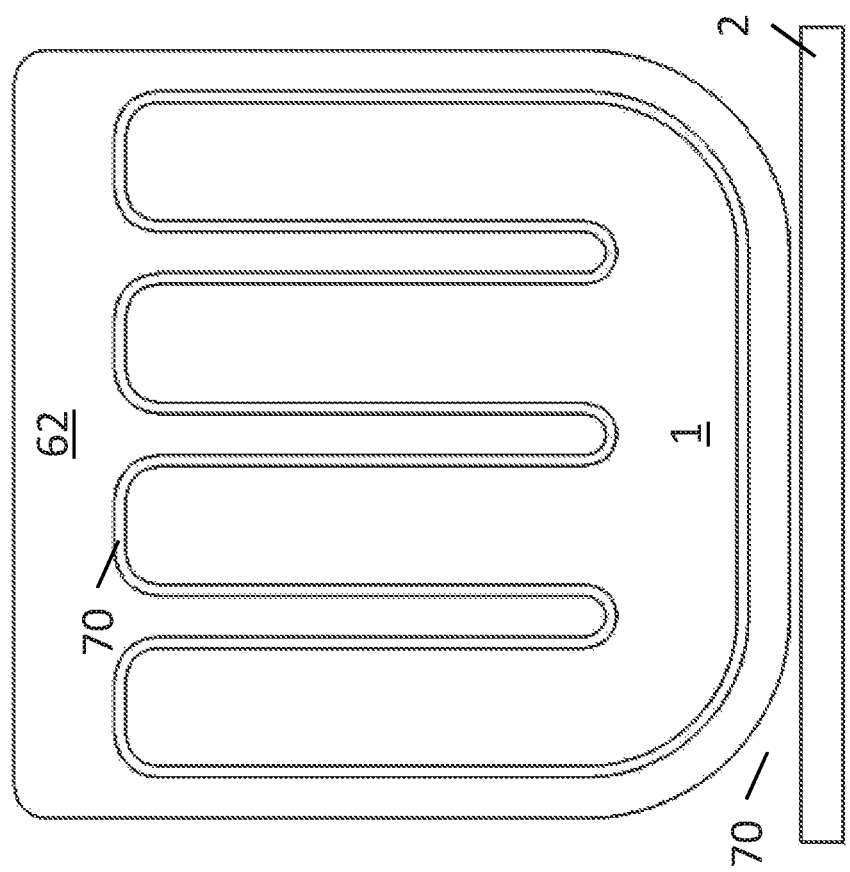

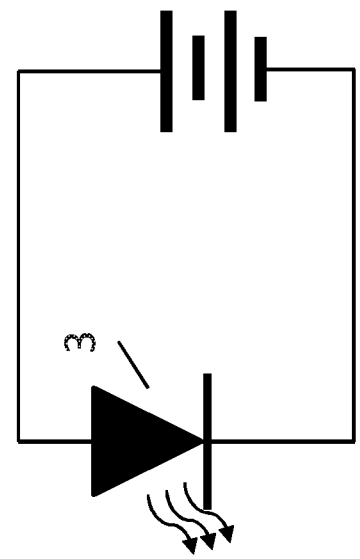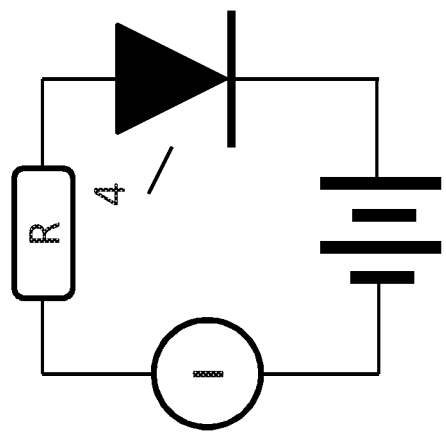
FIG. 7B

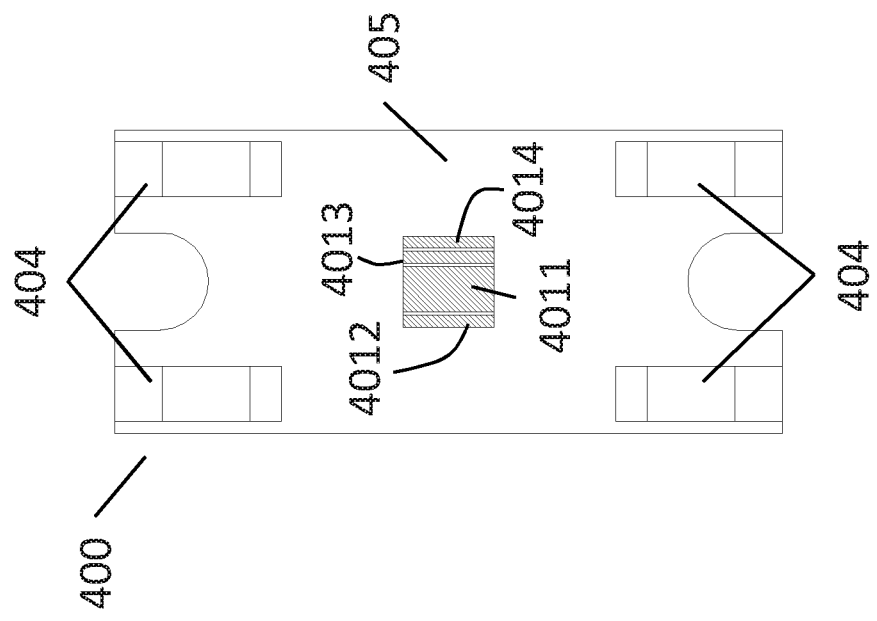

LIGHT-EMITTING DEVICE WITH OPTICAL POWER READOUT

CROSS-REFERENCE TO RELATED APPLICATION

This application is a continuation of patent application Ser. No. 16/984,008, filed on Jul. 26, 2018.

FIELD OF THE INVENTION

The present invention relates in general to semiconductor light emitting technology and, more particularly, to a light-emitting device, such as a group III nitride ultraviolet light-emitting diode, with optical power readout.

DESCRIPTION OF THE RELATED ART

Deep ultraviolet (DUV) emissions (200-280 nm) owing to germicidal effect hold solutions to a number of challenging problems facing humanity, e.g., the increasing scarcity of clean water, overuse of antibiotics, and drug-resistance of pathogens, etc. Traditional DUV light sources involving toxic chemical mercury are to be replaced by environment-friendly, solid-state DUV light sources such as AlGaN-based light-emitting diodes (LEDs).

UV emissions, unlike visible light, are not perceptible by human naked eyes. A direct visual readout of the UV output power on chip-level is highly desired for at least the following reasons. First, a successful disinfection of pathogen necessarily requires sufficient DUV irradiation dosage, which differs for different pathogens. Since dosage is the product of UV irradiance and irradiation duration, it is important to real-time monitor the UV emission power or irradiance level to have a reliable disinfection treatment. Second, UV light sources, including AlGaN-based UV LEDs, are normally subjected to output power decay as the light sources age. To retain a preset constant output power is desired during the life span of a UV light source for various applications.

In general, a separate photodetector can be used to measure the light source power and, with the help of a feedback circuit, constant output power can be maintained, for example, according to the teachings given by U.S. Pat. No. 4,190,795. Even better, a photodetector (PD) and an LED can be integrated in one chip, making a monolithic opto-coupler so as to monitor the LED's output power, as disclosed by US patent application publication US20130299841, and U.S. Pat. Nos. 5,753,928 and 9,685,577. The contents of these patents and patent applications are incorporated herein by reference in their entirety.

SUMMARY

A light emitting device, such as a light emitting diode or a laser diode, with on-chip optical power readout is provided. The light emitting device has a light emitting mesa and a light detecting mesa formed adjacent to each other on the same substrate of a chip, A first aspect of the present invention provides a light emitting device with optical power readout, which includes:

a substrate;

a light emitting mesa formed over the substrate; wherein the light emitting mesa comprises a first n-AlGaN structure, a first p-type p-AlGaN structure, and a first active region sandwiched between the first n-AlGaN structure and the first p-type p-AlGaN structure; and a light detecting mesa formed over the substrate, wherein the light detecting mesa comprises a second n-AlGaN structure, a second p-type p-AlGaN structure, and a second active region sandwiched between the second n-AlGaN structure and the second p-type p-AlGaN structure, wherein the first and second n-AlGaN structures are of the same epitaxial structure, the first and second p-type p-AlGaN structures are of the same epitaxial structure, and the first and second active regions are of the same epitaxial structure, and wherein the light emitting mesa and the light detecting mesa are at least partially separated by an insulation region, so that the first active region and the first p-type p-AlGaN are insulated from the second active region and the second p-type p-AlGaN.

The width of the insulation region can be 5-95 μm.

The insulation region can be formed by an insulation layer, or an airgap, or ion implantation.

The first and second n-AlGaN structures can share a same n-AlGaN structure and a common n-contact metal.

The light detecting mesa receives part of the emissions given by the light-emitting mesa and responds with outputting an electrical signal.

The light emitting mesa and the light detecting mesa can be formed as follows:

forming a n-AlGaN structure over the substrate, forming an active region on the n-AlGaN structure, and forming a p-type p-AlGaN structure on the active region; and dividing the n-AlGaN structure into the first n-AlGaN structure and the second n-AlGaN structure, the p-type p-AlGaN structure into the first p-type p-AlGaN structure and the second p-type p-AlGaN structure, and the active region into the first active region and the second active region so as to form the light emitting mesa and the light detecting mesa.

The first n-AlGaN structure can include an n-type N—AlGaN layer with a thickness of 2.0-5.0 μm and a doping concentration of $2.0 \times 10^{18}$-$5.0 \times 10^{18}$ cm$^{-3}$ for current spreading, an n-type N$^+$—AlGaN layer with a thickness of 0.2-0.5 μm and a doping concentration of $8 \times 10^{18}$-$2 \times 10^{19}$ cm$^{-3}$ for active region polarization field screening, and an n-type N$^-$—AlGaN layer with a thickness of 0.1-0.5 μm and a doping concentration of n=$2.5 \times 10^{17}$-$2 \times 10^{18}$ cm$^{-3}$ for reducing current crowding and uniform current injection into the first active region.

The first active region can include a plurality of alternately stacked n-Al$_b$Ga$_{1-b}$N barriers and Al$_w$Ga$_{1-w}$N wells; a thickness of each of the n-Al$_b$Ga$_{1-b}$N barriers is in the range of 8-16 nm, and a thickness of each of the Al$_w$Ga$_{1-w}$N wells is 2-5 nm; the n-Al$_b$Ga$_{1-b}$N barrier and Al$_w$Ga$_{1-w}$N well have an Al-composition in the range of 0.3-1.0 (b=0.3-1.0) and 0.0-0.85 (w=0.0-0.85), respectively, and the Al-composition difference between the barrier and the well is at least 0.15 (b−w≥0.15).

The first p-type p-AlGaN structure can include a hole injecting and electron blocking layer, a hole spreading structure, and a hole supplier and p-contact layer. The hole injecting and electron blocking layer can be a p-AlGaN layer, or a p-AlGaN superlattice structure, or a p-AlGaN multilayer structure; the hole spreading structure can include alternately stacked p-type Mg-doped AlGaN or GaN channel and p-type AlN barrier; and the hole supplier and p-contact layer can be made of p-type InN, InGaN, GaN, AlGaN, or AlN.

An in-plan area of the light detecting mesa can be 5%-55% of that of the light emitting mesa.

The light emitting device with optical power readout of claim 1 can further include a UV reflection layer formed on at least a portion of an opposite surface of the substrate below the light detecting mesa.

A second aspect of the present invention provides a chip-on-board (COB) package with multiple electrical pads, which includes:

a metal-core print-circuit board (MCPCB);

a plurality of wire-to-board connectors; and a first chip bonding zone having a first p-pad for connecting a p-contact metal of the light emitting mesa of the light emitting device with optical power readout according to the first aspect of the present invention, a second p-pad for connecting a p-contact metal of the light detecting mesa of the light emitting device with optical power readout according to the first aspect of the present invention, and an n-pad for connecting the common n-contact metal of the light emitting mesa and the light detecting mesa of the light emitting device with optical power readout according to the first aspect of the present invention;

wherein each of the wire-to-board connectors is only electrically connected to one of the first p-pad, the second p-pad, and the n-pad.

The chip-on-board (COB) package with multiple electrical pads can further include a surface-mount-device (SMD) package bonded on the first chip bonding zone, wherein the SMD package, on its first surface, has a second chip bonding zone which contains a first p-pad for bonding the p-contact metal of the light-emitting mesa, a second p-pad for bonding the p-contact metal of the light detecting mesa, and a first n-pad for bonding the common n-contact metal; on a second surface of the SMD package, there are a third p-pad electrically connected to the first p-pad of the first chip bonding zone, a fourth p-pad electrically connected to the second p-pad of the first chip bonding zone, and a second n-pad electrically connected to the n-pad of the first chip bonding zone.

A third aspect of the present invention provides a chip-on-board (COB) package with multiple electrical pads, which includes:

a metal-core print-circuit board (MCPCB);

a plurality of wire-to-board connectors; and a first chip bonding zone having a first p-pad for connecting a p-contact metal of the light emitting mesa of the light emitting device with optical power readout according to the first aspect of the present invention, a second p-pad for connecting a p-contact metal of the light detecting mesa of the light emitting device with optical power readout according to the first aspect of the present invention, a first n-pad for connecting an n-contact metal of the light emitting mesa of the light emitting device with optical power readout according to the first aspect of the present invention, and a second n-pad for connecting an n-contact metal of the light detecting mesa of the light emitting device with optical power readout according to the first aspect of the present invention;

wherein each of the wire-to-board connectors is only electrically connected to one of the first p-pad, the second p-pad, the first n-pad and the second n-pad.

The chip-on-board (COB) package with multiple electrical pads can further include a surface-mount-device (SMD) package bonded on the first chip bonding zone, wherein the SMD package, on its first surface, has a second chip bonding zone which contains a first p-pad for bonding the p-contact metal of the light-emitting mesa, a second p-pad for bonding the p-contact metal of the light detecting mesa, a first n-pad for bonding the n-contact metal of the light emitting mesa, and a second n-pad for bonding the n-contact metal of the light detecting mesa; on a second surface of the SMD package, there are a third p-pad electrically connected to the first p-pad of the first chip bonding zone, a fourth p-pad electrically connected to the second p-pad of the first chip bonding zone, a third n-pad electrically connected to the first n-pad of the first chip bonding zone, and a fourth n-pad electrically connected to the second n-pad of the first chip bonding zone.

BRIEF DESCRIPTION OF THE DRAWINGS

The accompanying drawings, which are included to provide a further understanding of the invention and constitute a part of this application, illustrate embodiments of the invention and together with the description serve to explain the principle of the invention. Like reference numbers in the figures refer to like elements throughout, and a layer can refer to a group of layers associated with the same function.

FIGS. 2A-2D show plan views of four different DUV LEDs according to four embodiments of the present invention.

FIG. 7B illustrates the equivalent circuit of the embodiment shown in FIG. 7A.

FIG. 8 shows top view of a chip-on-board metal-core print-circuit-board package for a UV LED according to an embodiment of the present invention.

DETAILED DESCRIPTION OF EMBODIMENTS

Figure 1A:
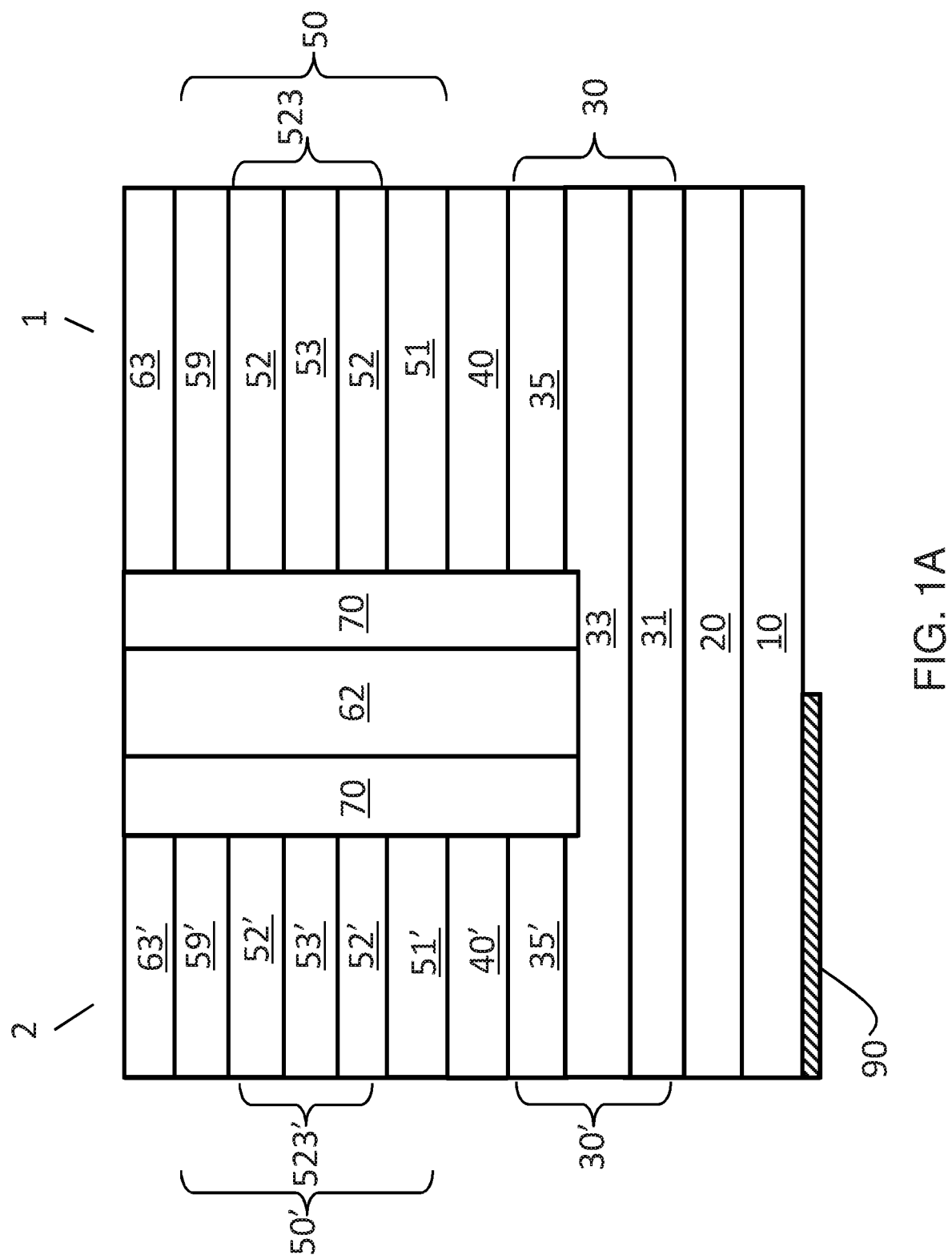
FIG. 1A shows the schematic layered structure of a DUV LED according to an embodiment of the present invention.

Throughout the specification, the embodiments are disclosed for group III nitride light-emitting devices. The teachings can also be extended to light-emitting devices made of other materials. The term group III nitride in general refers to metal nitride with cations selected from group IIIA of the periodic table of the elements. That is to say, group III-nitride includes AlN, GaN, InN and their ternary (AlGaN, InGaN, InAN) and quaternary (AlInGaN) alloys. In this disclosure, a quaternary can be reduced to a ternary for simplicity if one of the group III elements is significantly small so that its existence does not affect the intended function of a layer made of such material. For example, if the In-composition in a quaternary AlInGaN is significantly small, smaller than 1%, then this AlInGaN quaternary can be shown as ternary AlGaN for simplicity. Using the same logic, a ternary can be reduced to a binary for simplicity if one of the group III elements is significantly small. For example, if the In-composition in a ternary InGaN is significantly small, smaller than 1%, then this InGaN ternary can be shown as binary GaN for simplicity. Group III nitride may also include small amount of transition metal nitride such as TiN, ZrN, HfN with molar fraction not larger than 10%. For example, group III-nitride or nitride may include $Al_xIn_yGa_zTi_{(1-x-y-z)}N$, $Al_xIn_yGa_zZr_{(1-x-y-z)}N$, $Al_xIn_yGa_zHf_{(1-x-y-z)}N$, with $(1-x-y-z) \leq 10\%$.

As well known, light emitting devices such as light emitting diodes (LEDs) and laser diodes, commonly adopt a laminate structure containing a multiple-quantum-well (MQW) active region, an n-type (group III nitride) structure for injecting electrons into the active region, and a p-type (group III nitride) structure on the other side of the active region for injecting holes into the active region.

Embodiments of the present invention provide a light emitting device, such as a light emitting diode or a laser diode, with on-chip optical power readout. In such a light emitting device, a light emitting mesa and a light detecting mesa are formed adjacent to each other on the same substrate of a chip, and a portion of the light emitted from the light emitting mesa is transmitted to the light detecting mesa at least through the substrate. The light emitting mesa and the light detecting mesa can be electrically isolated from each other, for example, by an insulation layer, or an airgap formed therebetween, or by ion implantation. The light emitting mesa and the light detecting mesa can also share an n-type structure, such as an n-type group III nitride structure, so that the light emitting mesa and the light detecting mesa share a common n-electrode while having their own p-electrode, respectively. The light emitting mesa and the light detecting mesa have exactly the same epitaxial structure, which can be achieved by sequentially forming an n-type structure, an active region, and a p-type structure over a substrate, and then dividing the n-type structure, the active region, and the p-type structure into two parts, for example, via a lithography process, one part forming the light emitting mesa, the other part forming the light detecting mesa. The light emitting mesa can be any conventional LED structure or laser diode structure.

Optionally, multiple light emitting mesas and/or multiple light detecting mesas can be formed on the same chip, for example, via the process described above. For example, one light emitting mesa and multiple light detecting mesas, or multiple light emitting mesas and one light detecting mesa, or multiple light emitting mesas and multiple light detecting mesas can be formed on one chip. The light emitting mesas and the light detecting mesas can share an n-type structure, so that each of the light emitting mesas and each of the light detecting mesas share a common n-electrode while having its own p-electrode, respectively. The light emitting mesas and the light detecting mesas can also be electrically isolated from each other, for example, by an insulation layer, or an airgap formed therebetween, or by ion implantation.

A light emitting diode with optical power readout according to embodiments of the present invention can be made from a light emitting diode by dividing the light emitting diode into a light emitting mesa and a light detecting mesa. Thus, the light emitting mesa and the light detecting mesa have exactly the same layered epitaxial structure. The light emitted from the light emitting mesa is detected by the light detecting mesa. The light emitting mesa can be of any conventional LED structure.

In the following, descriptions have been made taking an AlGaN based DUV LED as an example, a person skilled in the art will appreciate that the principles and structures described below can be applied to other light emitting device such laser diodes and to other wavelength LEDs.

Illustration in FIG. 1A shows the schematic layered structure of a DUV LED with optical power readout according to an embodiment of the present invention. The structure includes a UV transparent substrate 10. Substrate 10 can be selected from sapphire, AlN, SiC, and the like. Formed on substrate 10 is a template 20, which can be made of a thick AlN layer, for example, with a thickness of 0.3-4.0 µm. Even though not shown in FIG. 1A, a strain management structure such as an Al-composition grading AlGaN layer or a set of AlN/AlGaN superlattice can be formed on template 20. Formed over template 20 is a thick n-AlGaN structure 30 for electron supply and n-type ohmic contact formation. Structure 30 may be of any n-type AlGaN structure adopted in a conventional LED. Optionally, structure 30 may include a thick (2.0-5.0 µm such as 3.0 µm, $n=2.0\times10^{18}$-$5.0\times10^{18}$ $cm^{-3}$) n-type N—AlGaN layer 31 for current spreading, a heavily n-type doped (0.2-0.5 µm such as 0.30 µm, $n=8\times10^{18}$-$2\times10^{19}$ $cm^{-3}$) $N^+$—AlGaN layer 33 for MQW active-region polarization field screening, and a lightly doped $N^-$—AlGaN layer 35 (0.1-0.5 µm such as 0.15 µm, $n=2.5\times10^{17}$-$2\times10^{18}$ $cm^{-3}$) to reduce current crowding and prepare uniform current injection into the following $Al_bGa_{1-b}N$/$Al_wGa_{1-w}N$ MQW active-region 40. Layer 33 is sandwiched between layer 31 and 35 with layer 35 facing MQW 40. MQW 40 can be any active region adopted in a conventional LED. In an embodiment, MQW 40 is made of alternately stacked n-$Al_bGa_{1-b}N$ barrier and $Al_wGa_{1-w}N$ well for a few times, for example, for 3-8 times. The thickness of a single barrier is in the range of 8-16 nm, and the thickness of a single well is 2-5 nm. The total thickness of MQW 40 is usually less than 200 nm, for example, being 75 nm, 100 nm, or 150 nm. The n-$Al_bGa_{1-b}N$ barrier and $Al_wGa_{1-w}N$ well may have an Al-composition in the range of 0.3-1.0 and 0.0-0.85, respectively, and the Al-composition difference of the barrier and well is at least 0.15 to ensure a barrier-well bandgap width difference ($\Delta E_g$) at least 400 meV to secure quantum confinement effect. Following MQW 40 is a p-type p-AlGaN structure 50, which in general can be of any layered structure adopted in a conventional LED. Optionally, the part of structure 50 in contact with MQW active-region 40 is a hole injecting and electron blocking layer (EBL) 51 which can be a p-AlGaN layer or a p-AlGaN superlattice structure, or a p-AlGaN multilayer structure. Following EBL 51 can be a hole spreading structure 523 including a p-type Mg-doped AlGaN or GaN channel 52 and a p-type AlN barrier 53. Barrier 53 and channel 52 form a two-dimensional hole gas in channel 52 for lateral current spreading. The Al composition in channel 52 can be small, or vanishing, for example, the Al composition can be in the range of 0 to 0.1 (10%), or 0 to 0.05 (5%). And the thicknesses of barrier 53 and channel 52 can be 1-3 nm and 0.5-1.5 nm, respectively. Further, barrier 53 and channel 52 can be alternately formed for a few times, for example, 1-8 times, or 3-7 times, but always with a layer of channel 52 contacting EBL 51 and another layer of channel 52 contacting a hole supplier and p-contact layer 59. The total thickness of p-AlGaN structure 50 is usually less than 100 nm, for example, being 50 nm, or 70 nm. Hole supplier and p-contact layer 59 can be heavily doped with Mg, to a concentration above $10^{20}$ $cm^{-3}$, for example from $1.0\times10^{20}$ $cm^{-3}$ to $1.0\times10^{21}$ cm$^{-3}$, or from $2.0\times10^{20}$ cm$^{-3}$ to $6.0\times10^{20}$ cm$^{-3}$. Layer 59 can be made of p-type InN, InGaN, GaN, AlGaN, or AlN.

The DUV LED structure shown in FIG. 1A contains a light emitting mesa 1 and a light detecting mesa 2. These two mesas are of exactly the same epitaxial structure, which means that the corresponding layers of the two mesas are simultaneously formed in the same epitaxial growth step and usually are of the same composition, doping, and thickness. Mesas 1 and 2 respectively comprise n-AlGaN structures 30 and 30', MQWs 40 and 40', p-AlGaN structures 50 and 50', and p-contact metals 63 and 63'. That is to say, for example, n-AlGaN structure 30 and n-AlGaN structure 30' are the same in terms of layer composition, doping, and thickness, so is true for p-AlGaN structure 50 and p-AlGaN structure 50', MQW 40 and MQW 40', p-contact metal 63 and p-contact metal 63'. Light emitting mesa 1 and light detecting mesa 2 are electrically connected only through n-AlGaN structures 30 and 30'. Their corresponding MQWs (40 and 40'), p-AlGaN structures (50 and 50') and p-contact metals (63 and 63') are electrically separated from each other, for example, by insulating layer 70. Layer 70, optionally UV transparent, can be made of epoxy, resin, and dielectrics such as silicon nitride and silicon dioxide (SiO$_2$). Layer 70 can also be an airgap. Layer 70 can further be a region with the same epitaxial structure as mesas 1 and 2, except that the region is heavily ion-implanted to achieve electrical insulation. The ion-implantation for electrical insulation can be achieved via high energy high dosage H$^+$, He$^+$, and Ar$^+$ implantation. Also formed on n-AlGaN structure 30—is an n-contact metal 62 which is separated from the light emitting mesa 1 and the light detecting mesa 2 by layer 70, as shown in FIGS. 1A and 2A-2D. N-contact metal 62 is preferably formed on the heavily n-typed doped region of n-AlGaN structure 30, which as shown in FIG. 1A is N$^+$—AlGaN layer 33. There is no specific requirement to the width of layer 70 as long as it can provide proper insulation between light emitting mesa 1 and light detecting mesa 2. Usually, the width of layer or insulation region 70 can be in the range of a few microns to a few tens of microns, for example, 5-95 or 20-60 μm. The width of layer 70 as seen from FIGS. 2A-2D is defined as the narrowest distance between n-contact metal 62 and light emitting mesa 1 or light detecting mesa 2.

Figure 1B:
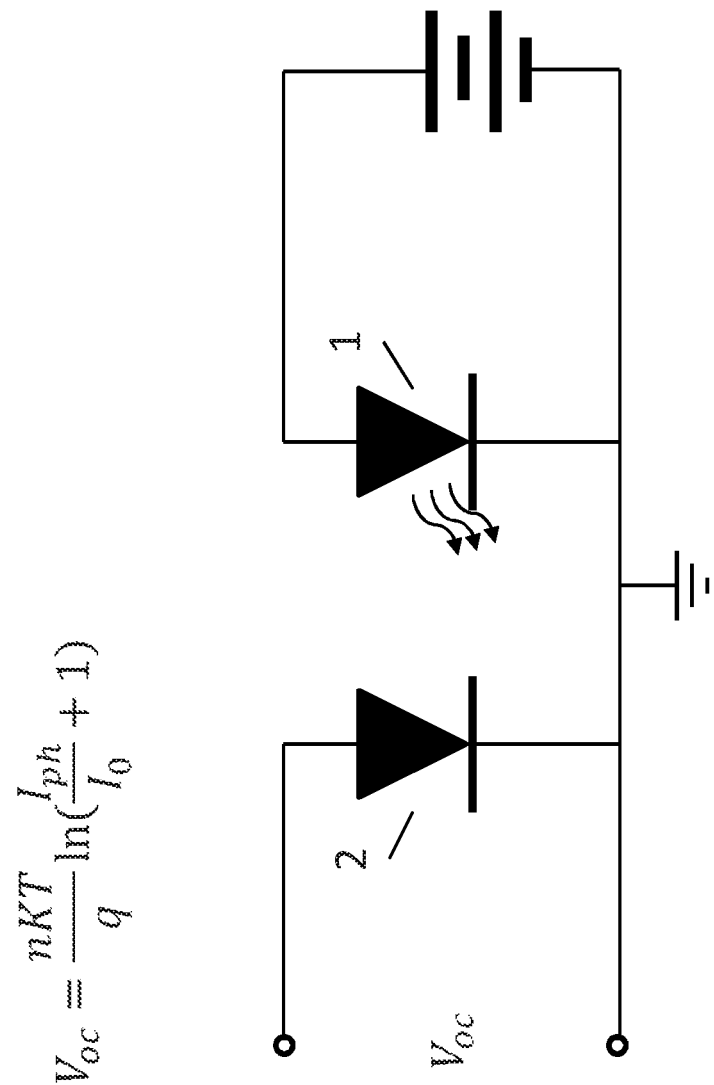
FIG. 1B illustrates the equivalent circuit of the embodiment shown in FIG. 1A.
Figure 1C:
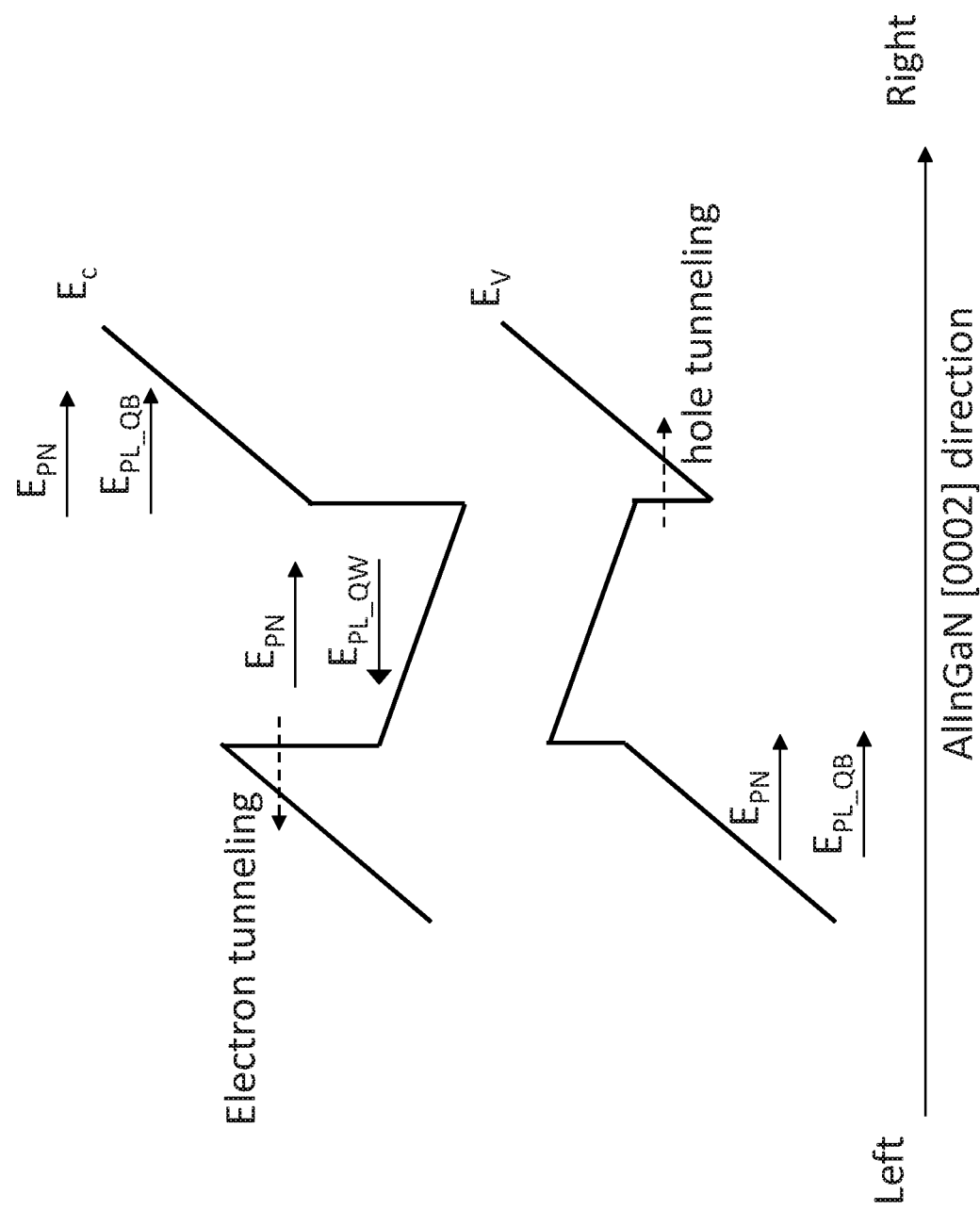
FIG. 1C illustrates the electric fields within the quantum well and barrier of the embodiment shown in FIG. 1A.

FIG. 1B illustrates the equivalent circuit of the DUV LED shown in FIG. 1A. As seen, when light emitting mesa 1 is forward biased, current can flow through (MQW 40) and UV light is emitted. Light detecting mesa 2 is in the open-circuit status, however, its MQW 40' can absorb part of the UV emissions given by Mesa 1. While the UV emissions can be waveguided by substrate 10, template 20, N—AlGaN structure 30 and layer 70 from MQW 40 to MQW 40', substrate 10 plays the major role in optical waveguide effect because of its large thickness. When p-AlGaN structures 50 and 50' are UV transparent and p-contact metals 63 and 63' are UV reflective, the waveguide effect can be enhanced. The electric fields within MQW 40' facilitate photocurrent generation, as illustrated in FIG. 1C. There are two kinds of electric fields within MQW 40'. The PN junction built-in electric field, E$_{PN}$, due to p- and n-type doping respectively in structures 50' and 30', points from n-side to p-side (pointing to the right side in FIG. 1C). The polarization electric field within the quantum barrier, E$_{PL\_QB}$, points to the right, and that within the quantum well, E$_{PL\_QW}$, points to the left. Because of the relatively low doping efficiency and the large spontaneous and piezoelectric polarizations in the wide-band-gap AlGaN materials, the polarization electric field is close to or even larger than the PN junction built-in electric field. As seen, UV emissions absorbed by the quantum well will generate non-equilibrium electrons and holes in the conduction and valence band, respectively. These photoinduced carriers have increased lifetime because of spatial separation due to the net electric field within the quantum well. Meanwhile, the constructive effect of the polarization and PN junction built-in electric fields within the quantum barriers will greatly reduce the barrier height and increase the carrier tunneling probabilities (FIG. 1C), leading to increased photocurrent within light detecting mesa 2.

The open-circuit voltage, V$_{oc}$, of light detecting mesa 2 is calculated as follows.

$$V_{oc} = \frac{nKT}{q}\ln\left(\frac{I_{ph}}{I_0} + 1\right)$$

Where q, K, T, and n are respectively the electron's elementary charge, Boltzmann's constant, absolute temperature and PN junction ideality factor. I$_{ph}$ and I$_0$ are photocurrent and dark current, respectively. As seen, for large bandgap PN junction, dark current can be extremely small, leading to large open-circuit voltage. In fact, under high illumination (high I$_{ph}$), an ideal qV$_{oc}$ can approach the PN junction's bandgap width.

As seen from FIGS. 1A-1C, light emitting mesa 1 emits UV light and light detecting mesa 2 detects it and gives a voltage output in response. That is, light detecting mesa 2 is optically coupled to light emitting mesa 1, the more UV emissions received by light detecting mesa 2 from light emitting mesa 1, the better the coupling efficiency. The coupling efficiency is mainly determined by the substrate material and geometry designs of the light detecting and light emitting mesas.

To block environmental emissions sensed by light detecting mesa 2, so as to have a near environment-invariance optical output power readout of light emitting mesa 1, a shadow layer 90 can be formed on the other surface of substrate 10 on the regions facing light detecting mesa 2 (shown in FIG. TA). Shadow layer 90 greatly blocks scatter light such as daytime light or scattered UV emissions in the application environment. Layer 90 can be a metal or metal alloy layer of a few tens to a few hundreds of nanometers thick, such as 30-600 nm, or 50-400 nm, and can be selected from UV reflective or non-reflective metals or alloys such as Al, Rh, NiMg, AlMg, Pd, Ni, Ti, Pt, Au, et al. Layer 90 can also be made of non-metal materials such as polytetrafluoroethylene (PTFE, or teflon).

Figure 2A:
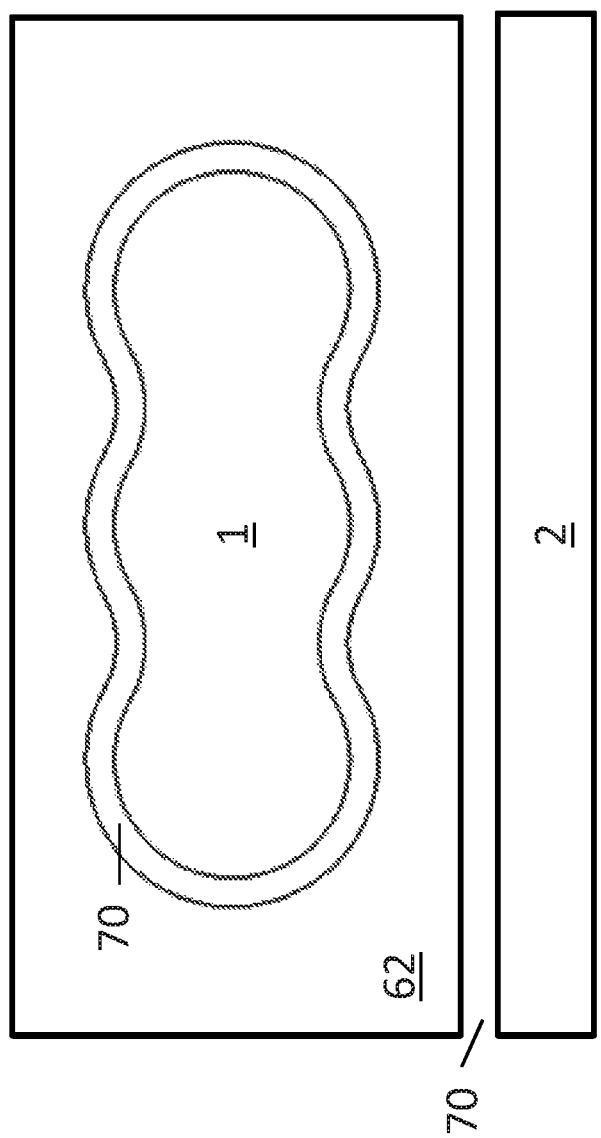
Figure 2C:
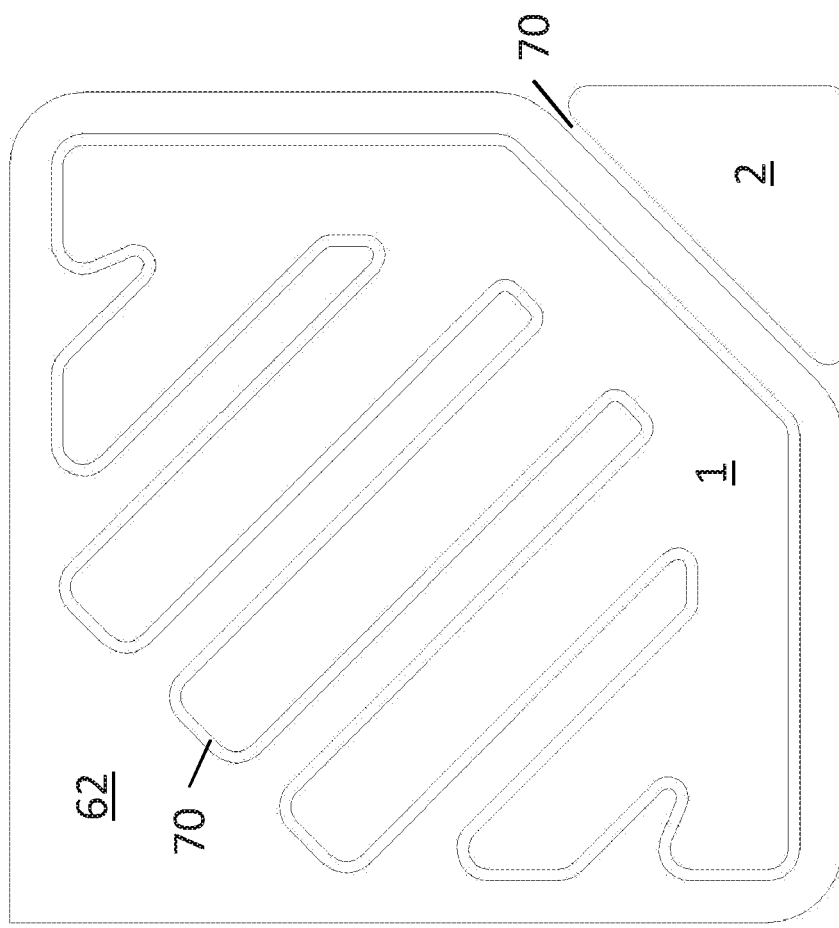
Figure 2D:
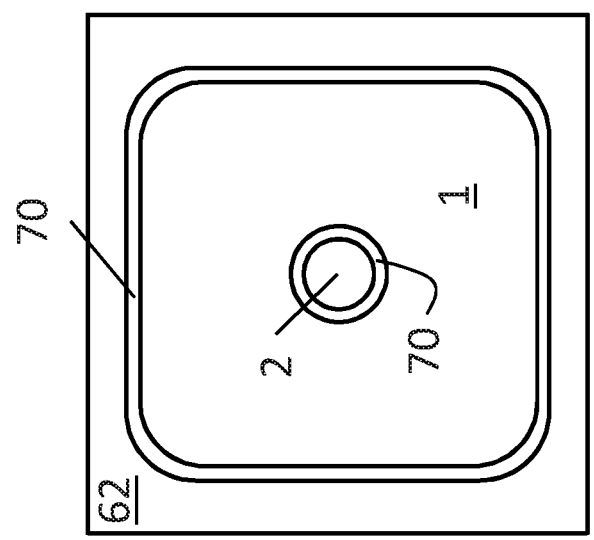

FIGS. 2A-2D show plan views of four different DUV LEDs according to FIG. 1A, aiming at demonstration of different geometry designs of the light detecting and light emitting mesas for different coupling efficiencies. The highest optical coupling efficiency can be obtained from the embodiment shown in FIG. 2D. This is a 1010 design (which means the chip dimensions are 10 mil by 10 mil), with the light detecting mesa 2 being surrounded by the light emitting mesa 1. Shown in FIG. 2A is a 2010 design (chip dimensions 20 mil by 10 mil), with the light detecting mesa 2 lying in parallel with the light emitting mesa 1, also with good optical coupling efficiency. FIGS. 2B and 2C show two 4545 designs (chip dimensions 45 mil by 45 mil) with reduced optical coupling efficiency to save more light emitting area, where the light emitting mesa 1 has a comb shape, and the light detecting mesa 2 is located at one side or the corner of the chip with the fingers of the comb extending away from the light detecting mesa 2. Although there are no specific requirements for the ratio between the in-plane area of the light emitting mesa 1 and the light detecting mesa 2, it is usually desirable to have an in-plane area of the light detecting mesa 2 as small as possible, as long as it can sufficiently detect the light emitted from the light emitting mesa 1, so as to save more light emitting area. The in-plane area of the light detecting mesa 2 can be less than 55% of that of the light emitting mesa 1, for example, being 5%-55%, or 8%-20% of that of the light emitting mesa 1.

Figure 3:
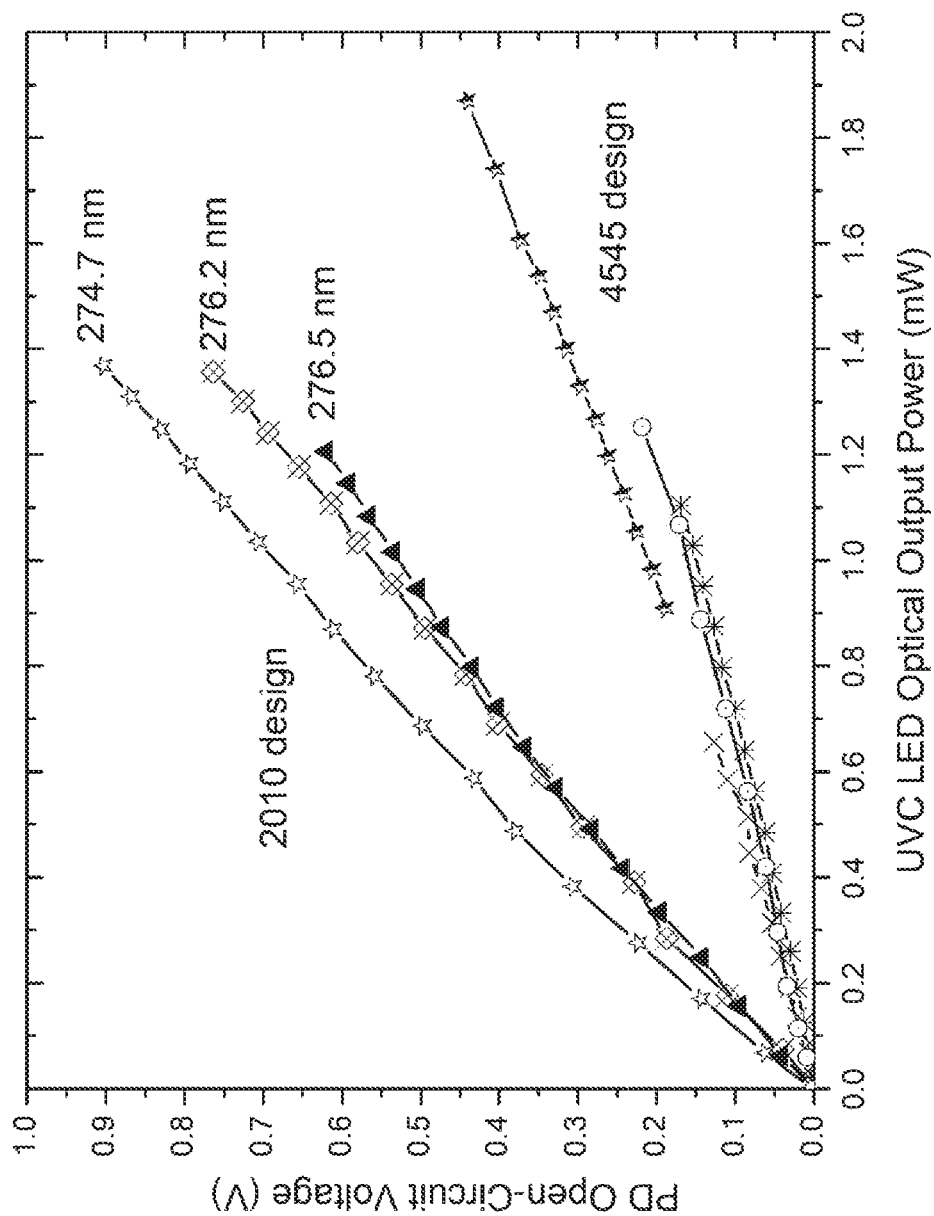
FIG. 3 plots the relationship of open-circuit photovoltage of the light-detecting mesa to the optical output power of the light-emitting mesa, of a few DUV LEDs according to FIG. 1A.

Plotted in FIG. 3 are some experimental data on the open-circuit voltage of the light detecting mesa 2, taken from the DUV LEDs according to FIGS. 1A, 2A and 2B. The $V_{oc}$ values of the light detecting mesas were measured and plotted against the light emitting mesas' optical output power values. These are called open-circuit-voltage response curves.

In these measurements, the specific light emitting/detecting mesa epitaxial structure is as follows.

The structure was formed on a c-plane sapphire substrate (10), starting with a 3.0 μm-thick AlN template 20, followed by N—AlGaN structure 30, consisting in sequence of a 2.5 m-thick Si-doped N—$Al_{0.58}Ga_{0.42}N$ layer ([Si]=$3.5.0\times10^{19}$ $cm^{-3}$) (layer 31), a heavily n-type doped 0.2 μm-thick ([Si]=$9.0\times10^{18}$ $cm^{-3}$) $N^+$—$Al_{0.58}Ga_{0.42}N$ layer (layer 33), and a lightly doped $N^+$—$Al_{0.55}Ga_{0.42}N$ layer (0.1 μm, [Si]=$2.5\times10^{17}$ $cm^{-3}$) (layer 35). MQW 40 had nine 12-nm-thick $Al_{0.55}Ga_{0.45}N$ quantum barriers and eight 4-nm-thick $Al_{0.4}Ga_{0.6}N$ quantum wells. The p-type AlGaN structure 50 has 4-pair Mg-doped 8-nm-thick-$Al_{0.75}Ga_{0.25}N$/4-nm-thick-$Al_{0.55}Ga_{0.45}N$ superlattice structure, and a 150-nm-thick Mg-doped GaN hole supplier layer.

Light emitting and light detecting mesas 1 and 2 were then formed via standard lithography and etch process according to the designs illustrated in FIGS. 2A and 2B. N-contact metal 62 and p-contact metal 63, 63' were Ti/Al/Ti/Au and Ni/Au multilayers, respectively. Insulating layer 70 simply was airgap. In this 2010 design according to FIG. 2A, the in-plane area values of the light emitting mesa 1 and light detecting mesa 2 are 0.043 and 0.022 $mm^2$, respectively In this 4545 design according to FIG. 2B, the in-plane area values of the light emitting mesa 1 and light detecting mesa 2 are 0.46 and 0.053 $mm^2$, respectively. In these 2010 and 4545 designs according to FIGS. 2A and 2B, the in-plane area values of the light detecting mesa 2 are about 51.1% and 11.5% of those of the light emitting mesa 1, respectively.

Referring to FIG. 3, the open-circuit-voltage response curves are linear for the optical power range measured. This indicates that $V_{oc}$ can be used to mark the UV LED's optical output power, provided with proper calibration. Hence, according to the present invention, using monolithic chip design and arranging a light detecting mesa to the vicinity of a light emitting mesa allow for measurable $V_{oc}$, with minimal consumption of the UV emission power. The $V_{oc}$ response curve slope is an indicator of the optical coupling efficiency between the light detecting mesa and the light emitting mesa. As seen, overall the 2010 design possessed better optical coupling efficiency than the 4545 design, with the slopes being 0.5-0.7 V/mW and 0.15-0.2 V/mW, respectively. For the same design, the slope changes with emission wavelength (the shorter the wavelength, the steeper the slope), since $V_{oc}$ is a function of bandgap width. As seen from the three open-circuit-voltage response curves of the 2010 design, a 1.5 nm change in the UVC wavelength (corresponding to bandgap width change of ~24.6 meV, close to room-temperature thermal energy) can result in noticeable slope change. The four open-circuit-voltage response curves of the 4545-design disperse less in slope because of the smaller dispersion in the emission wavelengths.

The UV LEDs according to the embodiments of FIG. 1A and FIGS. 2A-2D have three electrical pads, one p-pad for the light emitting mesa 1, one p-pad for the light detecting mesa 2, and one common n-pad for both mesas (tri-electrical-pad LED). This is in contrast to the conventional LED's two electrical pads. As such, different package designs are needed for these new tri-pad UV LEDs.

Figure 4:
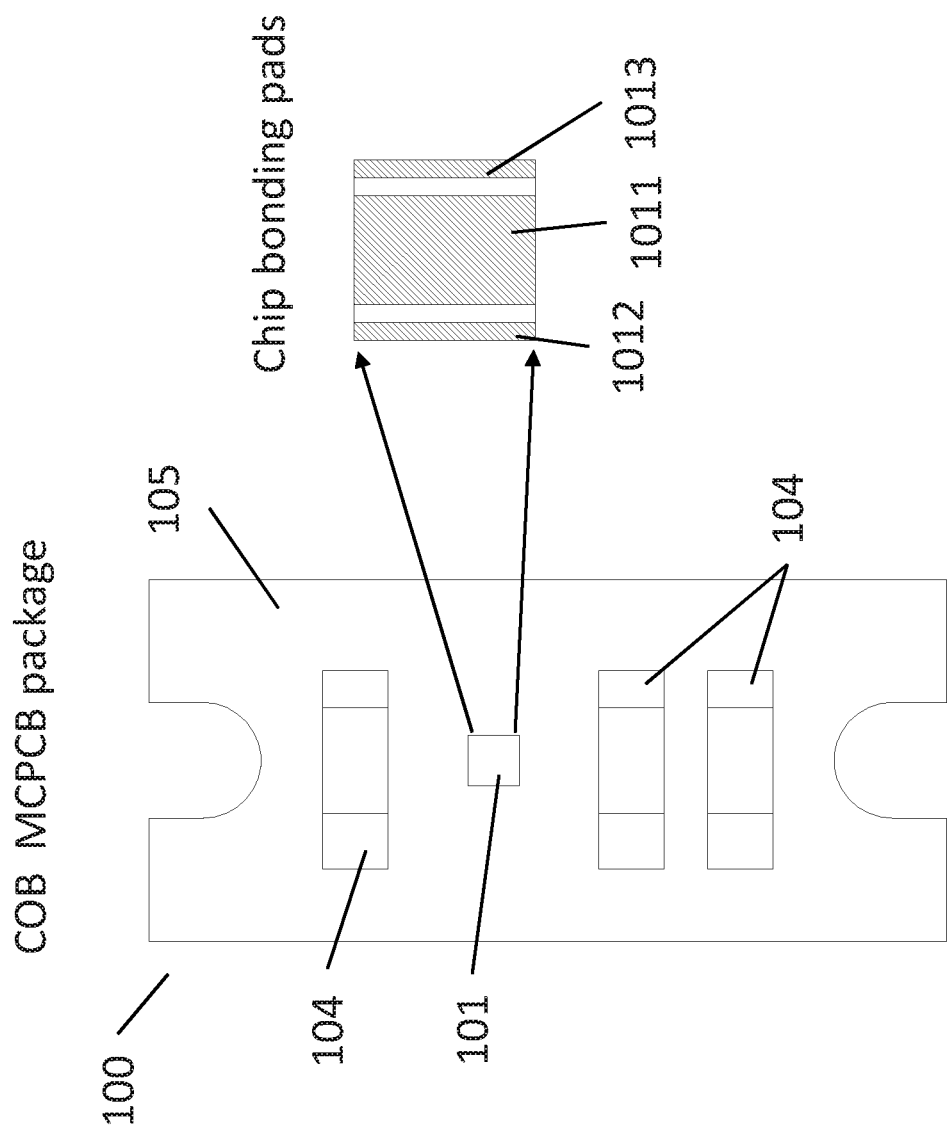
FIG. 4 shows top view of a chip-on-board (COB) metal-core print-circuit-board (MCPCB) package for a UV LED according to an embodiment of the present invention.

Illustrated in FIG. 4 is a chip-on-board (COB) package design with 3 electrical pads according to another aspect of the present invention. The COB package 100 contains a metal-core print-circuit board (MCPCB) 105, three wire-to-board connectors 104, and a chip bonding zone 101, which in turn contains a p-pad 1011 for p-contact metal 63 of light-emitting mesa 1, a p-pad 1013 for p-contact metal 63' of light-detecting mesa 2, and a common n-pad 1012 for n-contact metal 62. When bonding embodiment chip shown in FIG. 1A to COB package 100, p-contact metal 63 of light-emitting mesa 1, p-contact metal 63' of light-detecting mesa 2 and n-contact metal 62 are bonded to p-pad 1011, p-pad 1013 and common n-pad 1012, respectively. Furthermore, each of the three wire-to-board connectors 104 is only electrically connected to one of the three electrical pads (1011-1013) in the chip bonding zone 101. Wire-to-board connectors 104 allow external power sources and voltage meters to access the light emitting device packaged on COB package 100.

Figure 5:
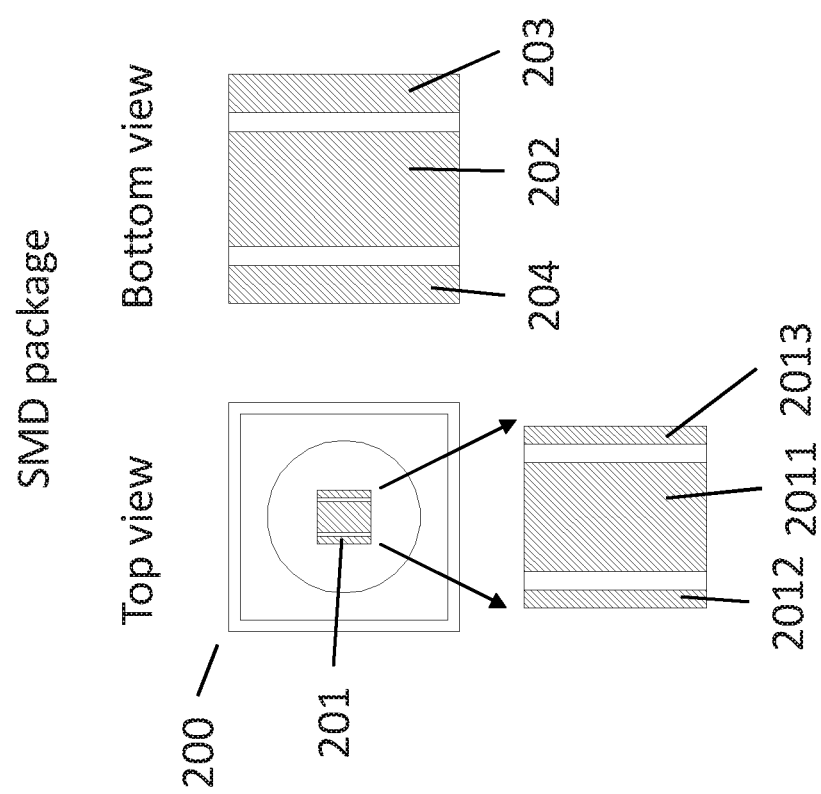
FIG. 5 shows top and bottom views of a surface-mount-device (SMD) package for a UV LED according to an embodiment of the present invention.

FIG. 5 shows top and bottom views of a surface-mount-device (SMD) package 200 for a tri-electrical-pad UV LED according to another aspect of the present invention. On the surface of the SMD package 200 there is a chip bonding zone 201, which contains a p-pad 2011 for p-contact metal 63 of light-emitting mesa 1, a p-pad 2013 for p-contact metal 63' of light-detecting mesa 2, and a common n-pad 2012 for n-contact metal 62. When bonding embodiment chip shown in FIG. 1A to SMD package 200, p-contact metal 63 of light-emitting mesa 1, p-contact metal 63' of light-detecting mesa 2 and n-contact metal 62 are bonded to p-pad 2011, p-pad 2013 and common n-pad 2012, respectively. On the backside of SMD package 200 there are SMD p-pad 202 electrically connected to p-pad 2011, SMD p-pad 204 electrically connected to p-pad 2013, and SMD common n-pad 203 electrically connected to common n-pad 2012. When bonding chip to SMD package 200, p-contact metal 63 of light-emitting mesa 1, p-contact metal 63' of light-detecting mesa 2 and n-contact metal 62 are bonded to p-pad 2011, p-pad 2013 and common n-pad 2012, respectively.

Figure 6:
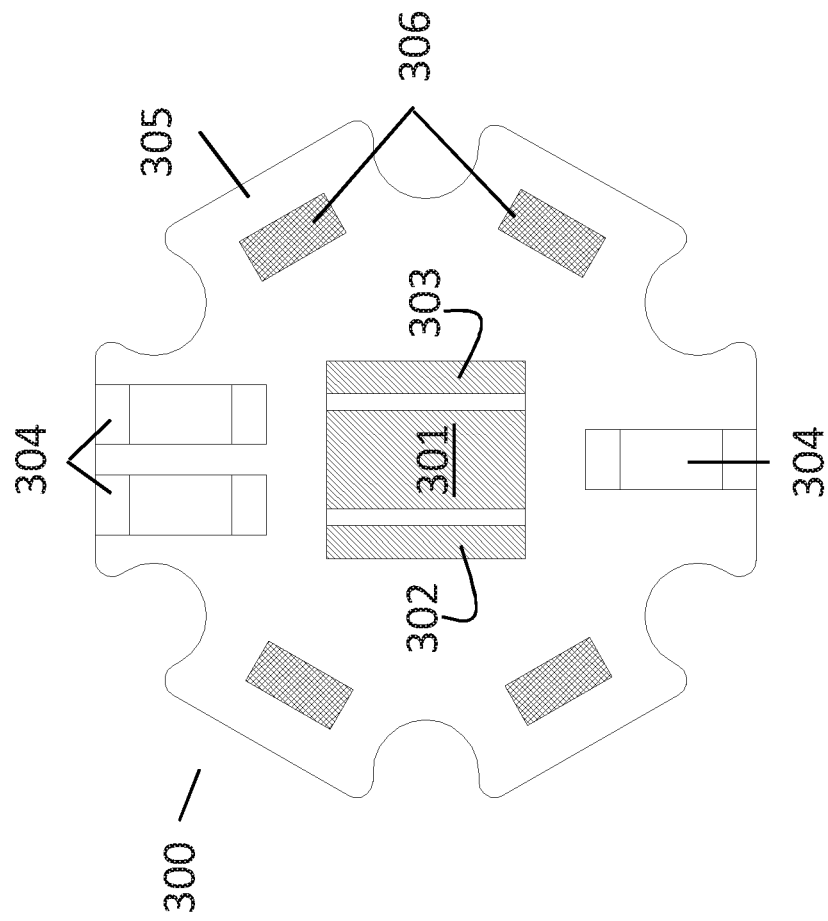
FIG. 6 shows top view of a star design MCPCB package for a SMD UV LED according to an embodiment of the present invention.

The SMD package 200 shown in FIG. 5 can be bonded to a star design MCPCB package 300, as shown in FIG. 6. Package 300 contains a star shaped MCPCB 305, 4 soldering pads 306, three wire-to-board connectors 304, a p-pad 301, a p-pad 303, and a common n-pad 302. When bonding SMD package 200 to package 300, SMD p-pads 202, 204, and SMD n-pad 203 are respectively bonded to package 300's p-pads 301, 303 and n-pad 302. Each of the three wire-to-board connectors 304 is only electrically connected to one of the three electrical pads (301, 302, 303). Each of soldering pads 306 is also only electrically connected to one of the three electrical pads (301, 302, 303). Wire-to-board connectors 304 and soldering pads 306 allow external power sources and voltage meters to access the light emitting device packaged on SMD 200 which is bonded to star MCPCB package 300.

Figure 7A:
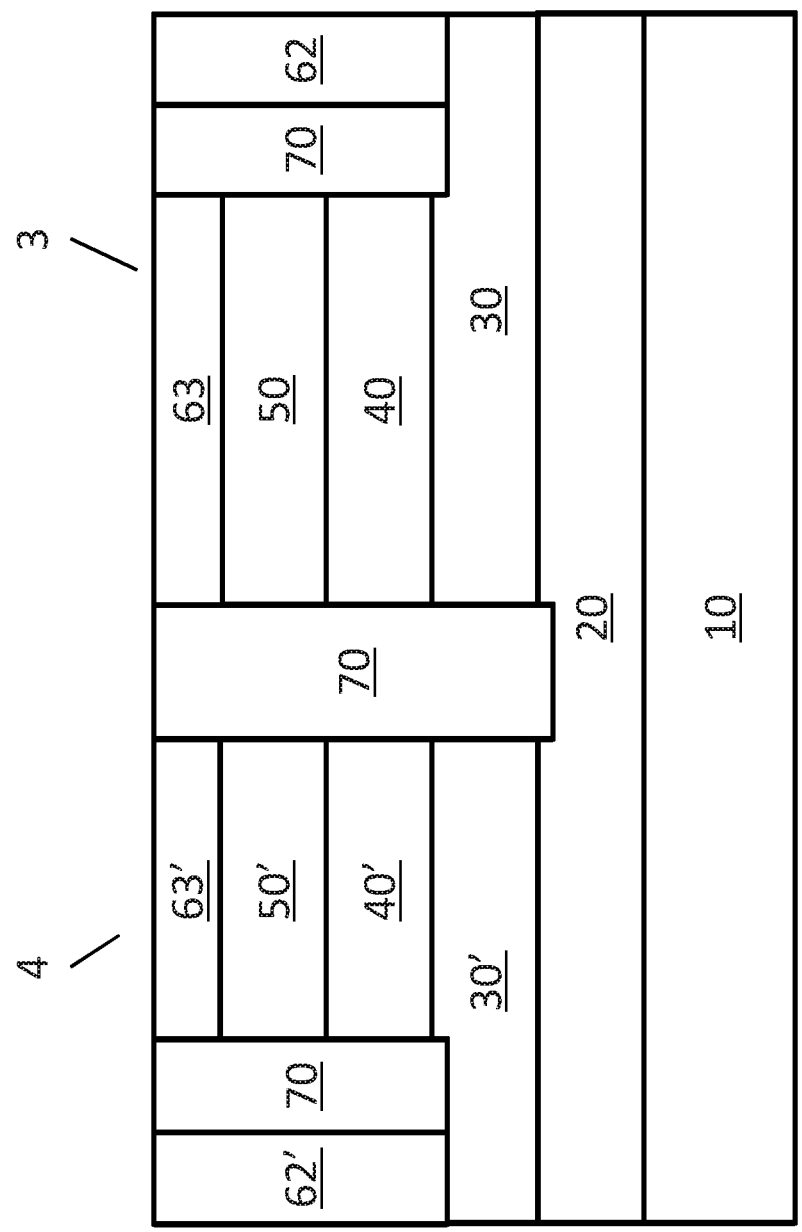
FIG. 7A shows the schematic layered structure of a DUV LED according to an embodiment of the present invention.

FIG. 7A shows the schematic layered structure of a DUV LED according to another embodiment of the present invention. In comparison to the DUV LED according the embodiment shown in FIG. 1A, this is a 4-electrical-pad (quad-electrical-pad) DUV LED, containing a light emitting mesa 3 and a light detecting mesa 4 of exactly the same epitaxial structure. However, light emitting mesa 3 and light detecting mesa 4 are totally electrically isolated from each other. Therefore 4 electrical contact pads are needed, with a p-contact pad and a n-contact pad for each of the light emitting and light detecting mesas. More specifically, the insulation layer 70 for separating light emitting mesa 3 and light detecting mesa 4 passes through n-AlGaN structure 30 and cuts into template 20 or substrate 10, while n-contact metal 62 and 62' is formed on n-AlGaN structure 30 and n-AlGaN structure 30', respectively, and separated from light emitting mesa 3 and light detecting mesa 4 by another layer 70 which cuts into but does not pass through n-AlGaN structure 30 or n-AlGaN structure 30', respectively, as shown in FIG. 7A.

FIG. 7B illustrates the equivalent circuit of the UV LED embodiment shown in FIG. 7A. As seen, when light-emitting mesa 3 is forward biased, current can flow through (MQW 40) and UV light is emitted. Light-detecting mesa 4 is reverse biased, to enlarge the PN junction electric field within the MQW 40' to more efficiently collect photocurrent. The photocurrent of light-detecting mesa 4 can be linearly dependent on the optical output power of light-emitting mesa 3 over a large range, making it useful to measure high UV optical power.

Illustrated in FIG. 8 is a quad-electrical-pad COB MCPCB package design for a UV LED according to FIG. 7A. The COB package 400 contains a MCPCB 405, four wire-to-board connectors 404, a p-pad 4011 for p-contact metal 63 of light-emitting mesa 3, a p-pad 4013 for p-contact metal 63' of light-detecting mesa 4, an n-pad 4012 for n-contact metal 62 of light-emitting mesa 3, and an n-pad 4014 for n-contact metal 62' of light-detecting mesa 4. Each of the four wire-to-board connectors 404 is only electrically connected to one of the four electrical pads (4011-4014). Wire-to-board connectors 404 allow external power sources and voltage meters to access the light emitting device 40 packaged on COB package 400. When bonding embodiment chip shown in FIG. 7A to COB package 400, p-contact metal 63 of light-emitting mesa 3, p-contact metal 63' of light-detecting mesa 4, n-contact metal 62 of light-emitting mesa 3 and n-contact metal 62' of light-detecting mesa 4 are bonded to p-pad 4011, p-pad 4013, n-pad 4012 and n-pad 4014, respectively.

Figure 9:
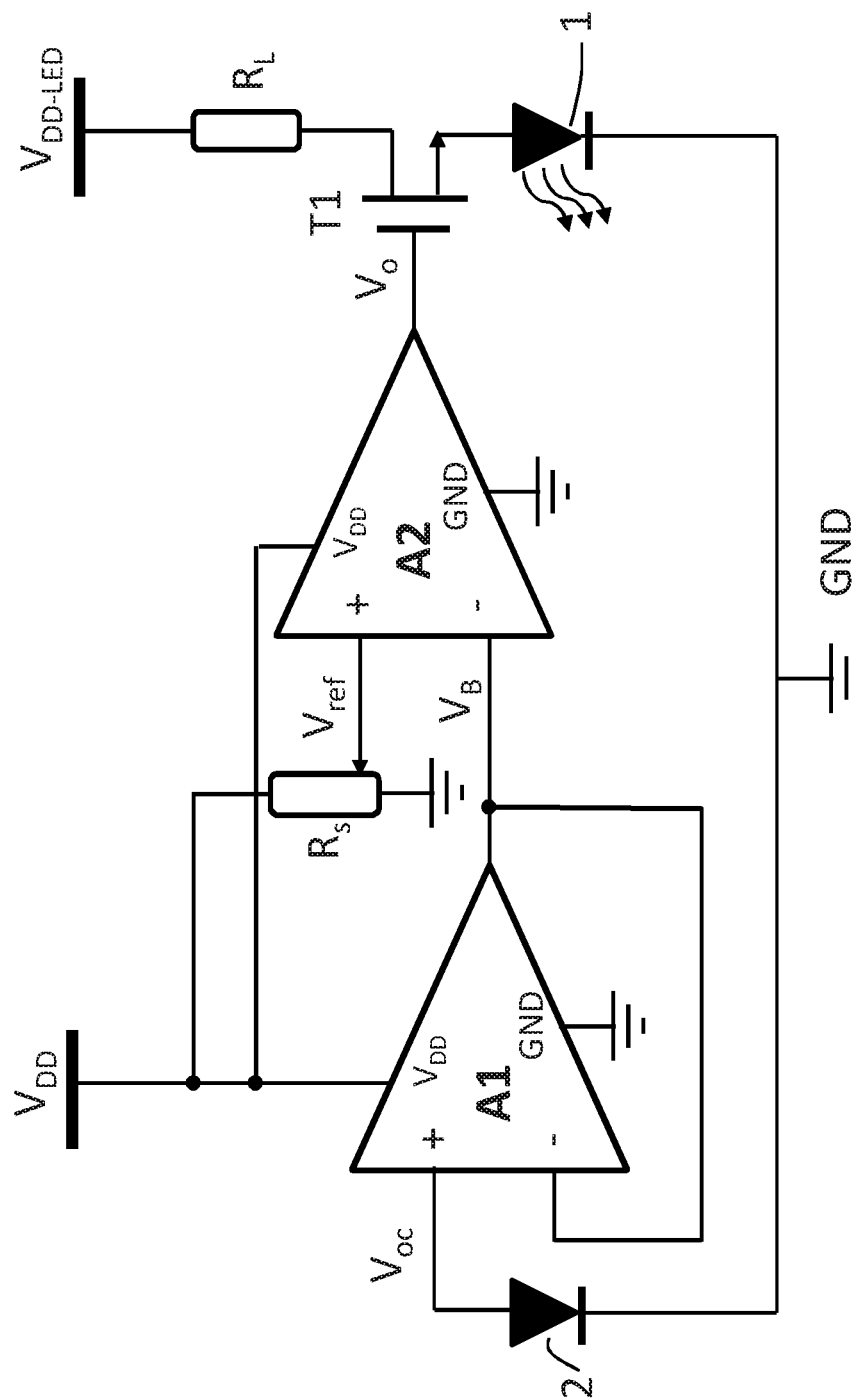
FIG. 9 shows a schematic UV light power readout and feedback control circuit for UV LEDs fabricated according to one aspect of the present invention.

FIG. 9 shows a schematic UV light power readout and feedback control circuit for UV LEDs fabricated according to FIG. TA. The open-circuit voltage of light-detecting mesa 2 ($V_{oc}$) is fed into the non-inverting input terminal of operational amplifier 1 (A1). The inverting input terminal of A1 is shorted to its output terminal, forcing the output voltage of A1, i.e., $V_B$, equal $V_{oc}$. Operational amplifier of this configuration is called a voltage follower or a unity gain buffer. It has very high input impedance and can avoid unwanted capacitive loading and improve loop stability.

$V_B$ is then fed into the inverting input terminal of operational amplifier 2 (A2), and a preset reference voltage, $V_{ref}$ is fed into the non-inverting input terminal of A2. Since A2 is in open loop configuration possessing very high gain, small difference of $V_{ref}$ and $V_B$ can result in large output voltage, $V_o$, and larger $V_o$ can drain more current through a power transistor T1 to light-emitting mesa 1. Light-emitting mesa 1 will then emit more UV light and lead $V_{oc}$ ($V_B$) increase to reduce the difference of $V_{ref}$ and $V_B$. This loop and feedback can stabilize the output power of light-emitting mesa 1 at any preset power level (given by $V_{ref}$) physically allowed by light-emitting mesa 1.

The present invention has been described using exemplary embodiments. However, it is to be understood that the scope of the present invention is not limited to the disclosed embodiments. On the contrary, it is intended to cover various modifications and similar arrangement or equivalents which can be obtained by a person skilled in the art without creative work or undue experimentation. The scope of the claims, therefore, should be accorded the broadest interpretation so as to encompass all such modifications and similar arrangements and equivalents.

What is claimed is:

1. A light emitting device with optical power readout, comprising:
   a substrate;
   a light emitting mesa formed over the substrate; wherein the light emitting mesa comprises a first n-AlGaN structure, a first p-type p-AlGaN structure, and a first active region sandwiched between the first n-AlGaN structure and the first p-type p-AlGaN structure; and
   a light detecting mesa formed over the substrate, wherein the light detecting mesa comprises a second n-AlGaN structure, a second p-type p-AlGaN structure, and a second active region sandwiched between the second n-AlGaN structure and the second p-type p-AlGaN structure,
   wherein the first and second n-AlGaN structures are of the same epitaxial structure, the first and second p-type p-AlGaN structures are of the same epitaxial structure, and the first and second active regions are of the same epitaxial structure,
   wherein the light emitting mesa and the light detecting mesa are at least partially separated by an insulation region, so that the first active region and the first p-type p-AlGaN are insulated from the second active region and the second p-type p-AlGaN,
   wherein sidewall of the light detecting mesa is completely surrounded by the light emitting mesa, and the insulation region is located between the light detecting mesa and the light emitting mesa, and
   wherein an in-plan area of the light detecting mesa is 5%-55% of that of the light emitting mesa.

2. The light emitting device with optical power readout of claim 1, wherein a width of the insulation region is 5-95 µm.

3. The light emitting device with optical power readout of claim 1, wherein the insulation region is formed by an insulation layer, or an airgap, or ion implantation.

4. The light emitting device with optical power readout of claim 1, wherein the first and second n-AlGaN structures share a same n-AlGaN structure and a common n-contact metal.

5. The light emitting device with optical power readout of claim 1, wherein the light detecting mesa receives part of emissions given by the light-emitting mesa and responds with outputting an electrical signal.

6. The light emitting device with optical power readout of claim 1, wherein the light emitting mesa and the light detecting mesa are formed as follows:
   forming a n-AlGaN structure over the substrate, forming an active region on the n-AlGaN structure, and forming a p-type p-AlGaN structure on the active region; and
   dividing the n-AlGaN structure into the first n-AlGaN structure and the second n-AlGaN structure, the p-type p-AlGaN structure into the first p-type p-AlGaN structure and the second p-type p-AlGaN structure, and the active region into the first active region and the second active region so as to form the light emitting mesa and the light detecting mesa.

7. The light emitting device with optical power readout of claim 1, wherein the first n-AlGaN structure comprises an n-type N—AlGaN layer with a thickness of 2.0-5.0 μm and a doping concentration of $2.0 \times 10^{18}$-$5.0 \times 10^{18}$ cm$^{-3}$ for current spreading, an n-type N$^+$—AlGaN layer with a thickness of 0.2-0.5 μm and a doping concentration of $8 \times 10^{18}$-$2 \times 10^{19}$ cm$^{-3}$ for active region polarization field screening, and an n-type N$^-$—AlGaN layer with a thickness of 0.1-0.5 μm and a doping concentration of $n = 2.5 \times 10^{17}$-$2 \times 10^{18}$ cm$^{-3}$ for reducing current crowding and uniform current injection into the first active region.

8. The light emitting device with optical power readout of claim 1, wherein the first active region comprises a plurality of alternately stacked n-$Al_bGa_{1-b}N$ barriers and $Al_wGa_{1-w}N$ wells; a thickness of each of the n-$Al_bGa_{1-b}N$ barriers is in the range of 8-16 nm, and a thickness of each of the $Al_wGa_{1-w}N$ wells is 2-5 nm; the n-$Al_bGa_{1-b}N$ barrier and $Al_wGa_{1-w}N$ well have an Al-composition in the range of 0.3-1.0 (b=0.3-1.0) and 0.0-0.85 (w=0.0-0.85), respectively, and the Al-composition difference between the barrier and the well is at least 0.15 (b−w≥0.15).

9. The light emitting device with optical power readout of claim 1, wherein the first p-type p-AlGaN structure comprises a hole injecting and electron blocking layer, a hole spreading structure, and a hole supplier and p-contact layer.

10. The light emitting device with optical power readout of claim 9, wherein the hole injecting and electron blocking layer is a p-AlGaN layer, or a p-AlGaN superlattice structure, or a p-AlGaN multilayer structure; the hole spreading structure comprises alternately stacked p-type Mg-doped AlGaN or GaN channel and p-type AlN barrier; and the hole supplier and p-contact layer is made of p-type InN, InGaN, GaN, AlGaN, or AlN.

11. The light emitting device with optical power readout of claim 1, further comprising a UV reflection layer formed on at least a portion of an opposite surface of the substrate below the light detecting mesa.

12. The light emitting device with optical power readout of claim 1, wherein the first n-AlGaN structure is insulated from the second n-AlGaN structure.

13. A chip-on-board (COB) package with multiple electrical pads, comprising:
a metal-core print-circuit board (MCPCB);
a plurality of wire-to-board connectors; and
a first chip bonding zone having a first p-pad for connecting a p-contact metal of the light emitting mesa of the light emitting device with optical power readout of claim 4, a second p-pad for connecting a p-contact metal of the light detecting mesa of the light emitting device with optical power readout of claim 4, and an n-pad for connecting the common n-contact metal of the light emitting mesa and the light detecting mesa of the light emitting device with optical power readout of claim 4;
wherein each of the wire-to-board connectors is only electrically connected to one of the first p-pad, the second p-pad, and the n-pad.

14. The chip-on-board (COB) package with multiple electrical pads according to claim 13, further comprising a surface-mount-device (SMD) package bonded on the first chip bonding zone, wherein the SMD package, on its first surface, has a second chip bonding zone which contains a first p-pad for bonding the p-contact metal of the light-emitting mesa, a second p-pad for bonding the p-contact metal of the light detecting mesa, and a first n-pad for bonding the common n-contact metal; on a second surface of the SMD package, there are a third p-pad electrically connected to the first p-pad of the first chip bonding zone, a fourth p-pad electrically connected to the second p-pad of the first chip bonding zone, and a second n-pad electrically connected to the n-pad of the first chip bonding zone.

15. A chip-on-board (COB) package with multiple electrical pads, comprising:
a metal-core print-circuit board (MCPCB);
a plurality of wire-to-board connectors; and
a first chip bonding zone having a first p-pad for connecting a p-contact metal of the light emitting mesa of the light emitting device with optical power readout of claim 12, a second p-pad for connecting a p-contact metal of the light detecting mesa of the light emitting device with optical power readout of claim 12, a first n-pad for connecting an n-contact metal of the light emitting mesa of the light emitting device with optical power readout of claim 12, and a second n-pad for connecting an n-contact metal of the light detecting mesa of the light emitting device with optical power readout of claim 12;
wherein each of the wire-to-board connectors is only electrically connected to one of the first p-pad, the second p-pad, the first n-pad and the second n-pad.

16. The chip-on-board (COB) package with multiple electrical pads according to claim 15, further comprising a surface-mount-device (SMD) package bonded on the first chip bonding zone, wherein the SMD package, on its first surface, has a second chip bonding zone which contains a first p-pad for bonding the p-contact metal of the light-emitting mesa, a second p-pad for bonding the p-contact metal of the light detecting mesa, a first n-pad for bonding the n-contact metal of the light emitting mesa, and a second n-pad for bonding the n-contact metal of the light detecting mesa; on a second surface of the SMD package, there are a third p-pad electrically connected to the first p-pad of the first chip bonding zone, a fourth p-pad electrically connected to the second p-pad of the first chip bonding zone, a third n-pad electrically connected to the first n-pad of the first chip bonding zone, and a fourth n-pad electrically connected to the second n-pad of the first chip bonding zone.

\* \* \* \* \*